United States Patent [19]

Lu

[11] Patent Number: 6,068,660
[45] Date of Patent: May 30, 2000

[54] METHOD AND APPARATUS FOR DETERMINING PARASITIC CAPACITANCE

[75] Inventor: Ning Lu, Essex Junction, Vt.

[73] Assignee: International Business Machines Corporation, Armonk, N.Y.

[21] Appl. No.: 09/102,470

[22] Filed: Jun. 22, 1998

[51] Int. Cl.$^7$ .............................. G06F 17/10; G06F 17/50
[52] U.S. Cl. ..................................... 703/2; 703/5
[58] Field of Search ......................... 395/500.23, 500.06, 395/500.02

[56] References Cited

U.S. PATENT DOCUMENTS

| | | | |
|---|---|---|---|
| 5,396,615 | 3/1995 | Tani . | |
| 5,452,224 | 9/1995 | Smith, Jr. et al. | 395/500.2 |
| 5,706,206 | 1/1998 | Hammer et al. | 364/489 |
| 5,737,237 | 4/1998 | Tanaka et al. | 364/491 |
| 5,761,080 | 6/1998 | DeCamp et al. | 395/500.06 |
| 5,903,469 | 5/1999 | Ho | 395/500.07 |
| 5,999,726 | 12/1999 | Ho | 395/500.6 |

OTHER PUBLICATIONS

K. Nabors & J. White, "FastCap: A Multipole Accelerated 3–D Capacitance Extraction Program," IEEE Trans. on Computer—Aided Design, vol. 10, No. 11, pp. 1447–1459 (Nov.–1991).

Raphael Reference Manual, Ver. 3.3, Technology Modeling Associates, Inc. Sunnyvale, CA, Chpt. 2, RC2 Two Dimensional Capacitance Analysis (May–1996).

M.I. Elmasry, "Capacitance Calculations in Mosfet VLSI," IEEE Electron Device Lett., vol. EDL–3, No. 1, pp. 6–7 (Jan.–1982).

C.P. Yuan & T.N. Trick, "A Simple Formula for the Estimation of the Capacitance of Two–Dimensional Interconnects in VLSI Circuits," IEEE Electron Device Lett., vol. EDL–3, No. 12, pp. 391–393 (Dec.–1982).

T. Skurai & K. Tamaru, "Simple Formulas for Two–and Three–Dimensional Capacitances," IEEE Trans. Electron Devices, vol. ED–30, No. 2, pp. 183–185 (Feb.–1983).

J.–H. Chern, J. Huang, L. Arledge, P.–C. Li, & P. Yang, IEEE Electron Device Lett., vol. EDL–13, No. 1, pp. 32–34 (Jan.–1992).

N.D. Arora, K.V. Raol, and L.M. Richardson, "Modeling and Extraction of Interconnect Capacitances For Multilayer VLSI Circuits," IEEE Trans. Computer–Aided Design of Integrated Circuits and Systems, vol. 15, No. 1, pp. 58–67 (Jan.–1996).

A.E. Ruehli & P.A. Brennan, "Efficient Capacitance Calculations for Three Dimensional Multiconductor Systems," IEEE Trans. on Microwave Theory and Tech. MTT–21, No. 2, pp. 76–82 (Feb.–1973).

A.E. Ruehli, "Survey of Computer–Aided Electrical Analysis of Integrated Circuit Interconnections," IBM J. Res. Develop., vol. 23, No. 6, pp. 626–639 (Nov.–1979).

P.E. Cottrell & E.M. Buturla, "VLSI Wiring Capacitance," IBM J. Res. Develop., vol. 29, pp. 277–288 (May–1985).

*Primary Examiner*—Kevin J. Teska
*Assistant Examiner*—Lonnie A. Knox
*Attorney, Agent, or Firm*—Ratner & Prestia; H. Daniel Schnurmann

[57] ABSTRACT

A method and apparatus for calculating parasitic capacitance between conductors of an integrated circuit. A physical structure which includes a conductive wire within an integrated circuit is considered. Limiting cases of the structure are then selected to simplify the derivation of an accurate parasitic capacitance expression. The limiting cases are simplified and structural variables may be combined, so as to reduce the data set necessary to extract or interpolate an expression for calculating the parasitic capacitance for each of the limiting cases. A second set of limiting cases, representing simplified physical structures, is then chosen. Again, simplification techniques are used to simplify each of the original limiting cases. The is simplified limiting case expressions are combined to derive a more generalized relationship where capacitance is a function of a reduced number of parameters. From this relationship, an interpolation may be used to produce a mathematical formula which may be used to calculate parasitic capacitance for more generalized structures.

16 Claims, 7 Drawing Sheets

$S_R$ = INFINITE $S_L$ = INFINITE, $S_R$ = INFINITE

| FIG. 8A | FIG. 8B | FIG. 8C |
|---|---|---|

$s = \text{INFINITE}, \; w \gg h$   →   $s = \text{INFINITE}, \; w \sim h$   ←   $s = \text{INFINITE}, \; w \ll h, t$
$C_{aa} = 2w/h + F_{aa}(h/t)$        $C_{ab} = 2w/h + F_{ab}(h/t, w/h)$        $C_{ac} = F_{ac}(h/t)$

↓

FIG. 8D $s \sim t, \; h \sim w$
$C_{bb} = 2w/h + 2t/s + F_{bb}(h/s, h/w, h/t)$

↑

$s \ll t, \; h \ll w$   →   $s \ll t, \; h \sim w$   ←   $s \ll t, \; h = \text{INFINITE}$
$C_{ca} = 2w/h + 2t/s + F_{ca}(h/s)$    $C_{cb} = 2w/h + 2t/s$    $C_{cc} = 2t/s + F_{cc}(s/w)$
                                        $+ F_{cb}(h/s, h/w)$

| FIG. 8E | FIG. 8F | FIG. 8G |
|---|---|---|

FIG. 9A    FIG. 9B

METHOD AND APPARATUS FOR DETERMINING PARASITIC CAPACITANCE

FIELD OF THE INVENTION

The present invention relates to methods and apparatus for calculating parasitic capacitance between conductors of an integrated circuit.

BACKGROUND OF THE INVENTION

Parasitic capacitance associated with the conductive elements of densely packed integrated circuits can affect device performance and result in unacceptable and unpredictable circuit performance. For example, such capacitance can significantly slow down the circuit operation and, particularly for analog circuits, can produce cross talk between conductors. It is desirable to predict the parasitic capacitance of a conducting element within an integrated circuit so that established design criteria will be based on accurate capacitance models. Excessive capacitance can be corrected in the design before the integrated circuit is fabricated.

Many methods exist for calculating the parasitic capacitance of a conductor within an integrated circuit. The parasitic capacitance of a conducting wire is a function of the elements comprising the structure which includes the conducting wire. A number of parameters describing the structure may be used to calculate the parasitic capacitance. The current art provides methods which use these parameters, and a matrix problem solving technique, to calculate the parasitic capacitance of a conductor within an integrated circuit.

The use of a matrix to calculate parasitic capacitance, for a single set of parameters describing a single conductive element, is a time consuming procedure. A typical integrated circuit contains a multitude of conductive elements in a number of various configurations. To calculate the parasitic capacitance for a multitude of conductive elements, each described by a different set of parameters representing a specific structure, may require considerable time. Thus, the use of a matrix procedure, for calculating the parasitic capacitance for an entire integrated circuit, may be unsuitable for chip and circuit design which involves up to millions of conductors within a single integrated circuit.

Other methods are available to calculate parasitic capacitance without using matrices. These methods may not be as accurate as desired. The deficiencies of the conventional methods for determining parasitic capacitance show that a need still exists for an improved method and apparatus for calculating parasitic capacitance between conductors of an integrated circuit.

SUMMARY OF THE INVENTION

To meet this and other needs, and in view of its purposes, the present invention provides a method and an apparatus for calculating parasitic capacitance. The parasitic capacitance of a conductor within an integrated circuit of a plurality of integrated circuits is approximated. A further parasitic capacitance is defined as a function of a data set including physical attributes corresponding to a further conductor within one of the integrated circuits. A first plurality of limiting cases is selected to reduce a plurality of variables used to interpolate a plurality of mathematical formulas for computing the further parasitic capacitance for each of the first limiting cases. An extraction, which may be a first layer interpolation, is performed to derive each of the plurality of mathematical formulas. A mathematical expression is then derived for calculating the further parasitic capacitance based upon the data set. This derivation is accomplished by performing a second layer interpolation between the plurality of mathematical formulas. The parasitic capacitance of the conductor is then calculated using the mathematical expression.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIGS. 4A–4C are also cross-sectional views, depicting three limiting cases for a structure in which a conductive wire within an integrated circuit is disposed between an upper metal film and a lower metal film:

FIGS. 5A–5C are also cross-sectional views of a conductive wire within an integrated circuit, illustrating limiting cases where a conductive wire lies on top of a metal film:

FIGS. 6A–6C are cross-sectional views of a conductive wire within an integrated circuit, depicting limiting cases of a single conductive wire on top of one metal film:

FIGS. 8A–8G provide a number of cross-sectional views of limiting cases of a conductive wire within an integrated circuit, illustrating an approach based on limiting cases to derive an expression for capacitance for a more general case:

FIGS. 9A and 9B depict two typical capacitance data curves (fringe capacitance):

DETAILED DESCRIPTION OF THE INVENTION

The present invention uses a simplification method for extracting accurate expressions for calculating the parasitic capacitance for a conductive wire in an integrated circuit. An integrated circuit may contain multiple layers of metalization. To calculate the parasitic capacitance for an individual conductive wire, that wire is desirably defined relative to the structure in which it appears, because the capacitance is defined in relation to associated conductive features within the structure in which the conductive wire appears. The conductive wire may be somewhat isolated: it may be nested within a series of parallel conductive wires in the same plane or it may lie between conductive wires on planes above, below, or both above and below it. The conductive wires of the planes above and below the conductive wire of interest may be disposed in the same direction or may constitute a metalized plane above the conductive wire at the location where capacitance is being calculated.

Figure 1:
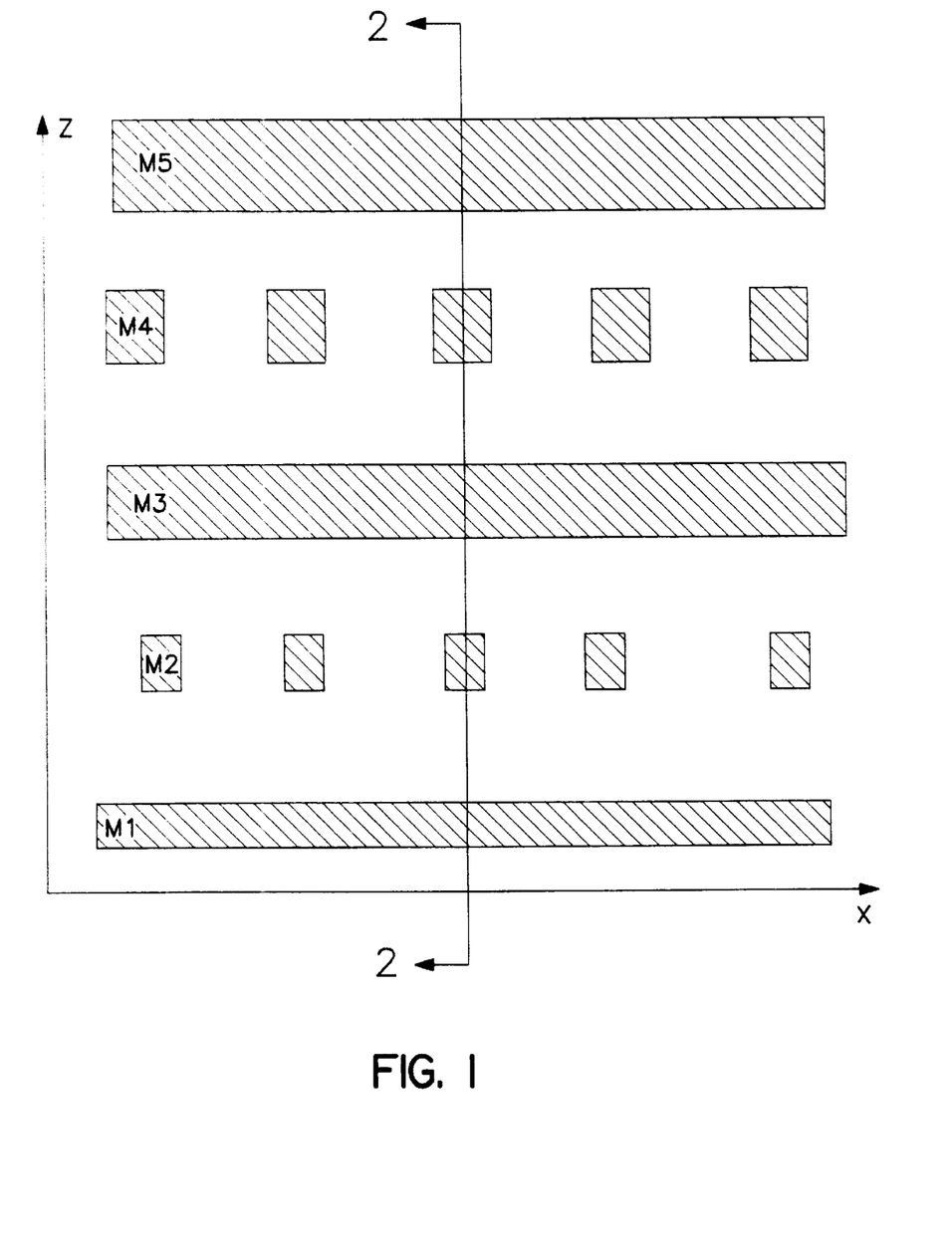
FIG. 1 is a cross-sectional view showing conductor wires for a multi-level metalization integrated circuit.
Figure 2:
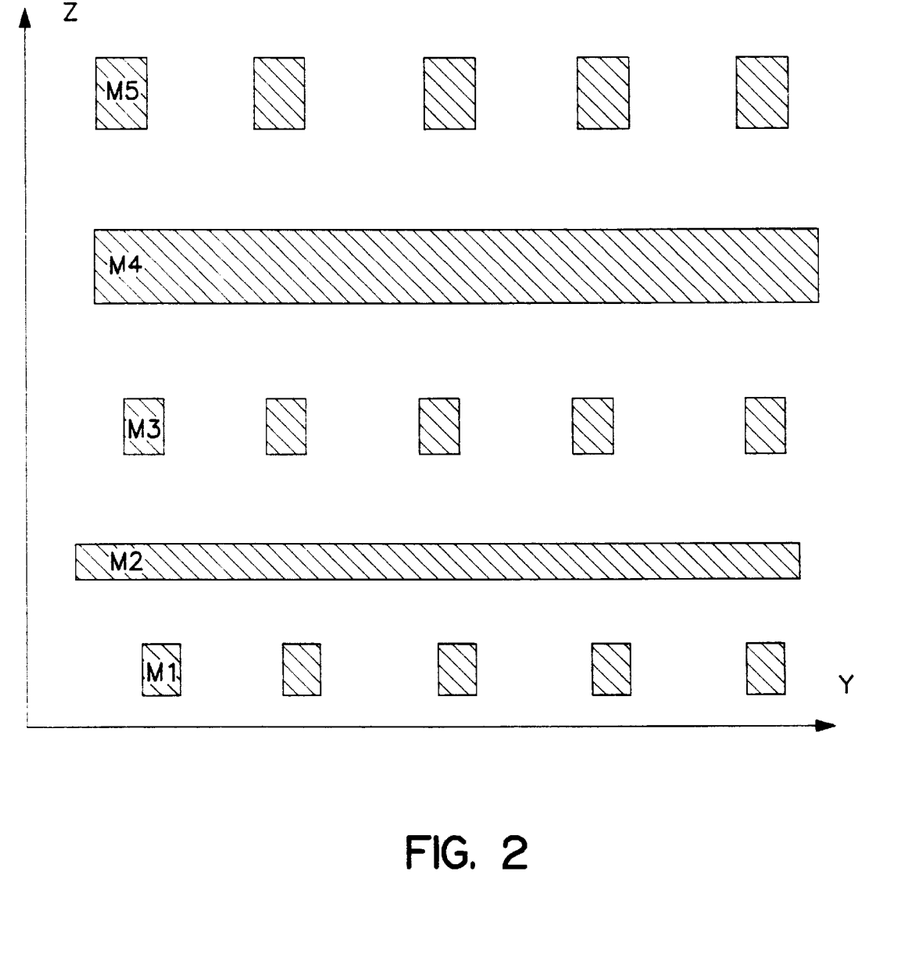
FIG. 2 is a cross-sectional view taken along the line 2—2 of FIG. 1.

FIG. 1 depicts a conductive wire within a five-level metalization scheme, depicted in the X-Z direction. FIG. 2 depicts a similar five-level metalization scheme shown in the Y-Z direction. In both FIG. 1 and FIG. 2, M1 represents the first metalization level, M2 represents the second metalization level, M3 represents the third metalization level, M4 represents the fourth metalization level, and M5 represents the fifth metalization level. FIG. 2 represents the plane taken along line 2—2 of FIG. 1. Together, FIGS. 1 and 2 show how conducting lines may criss-cross one another when in different planes, and produce different effects to be considered in calculating parasitic capacitance.

Figure 4A:
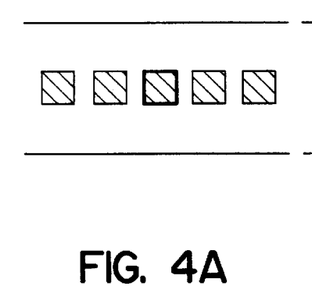
FIG. 4A depicts a conductive wire nested between conductive wires on both sides.
Figure 4B:
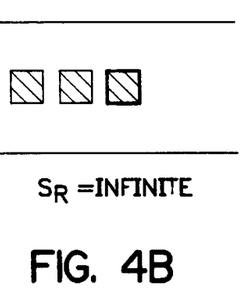
FIG. 4B depicts a conductive wire having adjacent conductive wires on one side only.
Figure 4C:
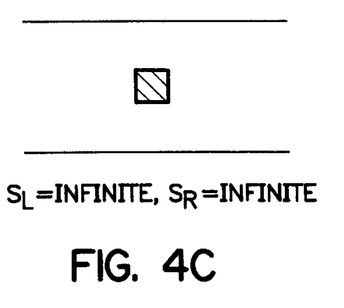
FIG. 4C depicts an isolated conductor wire.

Alternatively, as shown in FIGS. 4A, 4B, and 4C, the conductive wire may be rather isolated (as in FIG. 4C).

Figure 5A:
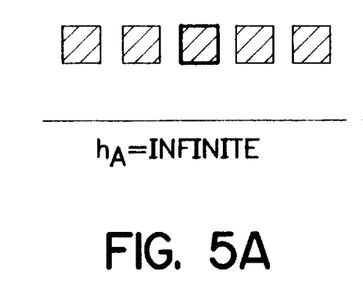
FIG. 5A depicts a conductive wire nested between conductive wires on both sides.
Figure 5B:
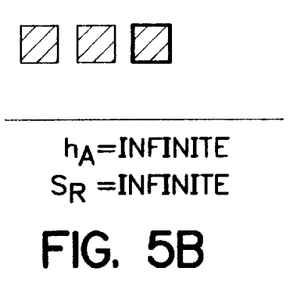
FIG. 5B depicts a conductive wire having adjacent conductive wires on one side only.
Figure 5C:
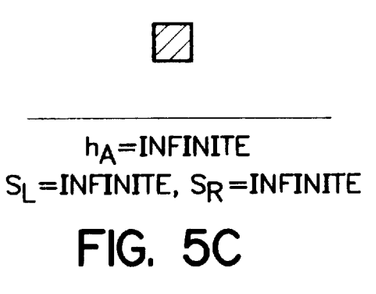
FIG. 5C depicts an isolated conductor wire.

FIGS. 5A, 5B, and 5C represent a structure with a conductive wire which is further isolated (as in FIG. 5C) as the conductive wire lies above a single metalized plane in a two-metalization scheme, or may represent the two uppermost levels of a multi-level metalization. From this discussion, it can be seen that the capacitance of a conductor within an integrated circuit may be derived from equations which take many forms.

Looking at an X-Z cross-section plane, the circuit wiring structure may look like FIG. 1 for a five-metal level design. At other cross-sections taken within the same integrated circuit, certain conductive wires (metal lines) may not be present depending on the circuit design and the precise location of the cross-section taken. To extract wiring capacitance for a given conductive wire, that conductive wire is defined in relation to the surrounding metal lines, because the parasitic capacitance of a wire is defined relative to its surrounding conductive features. In general, there is a larger parasitic wiring capacitance between closer metal lines; a parasitic wiring capacitance between two distant metal lines is smaller.

Figure 3:
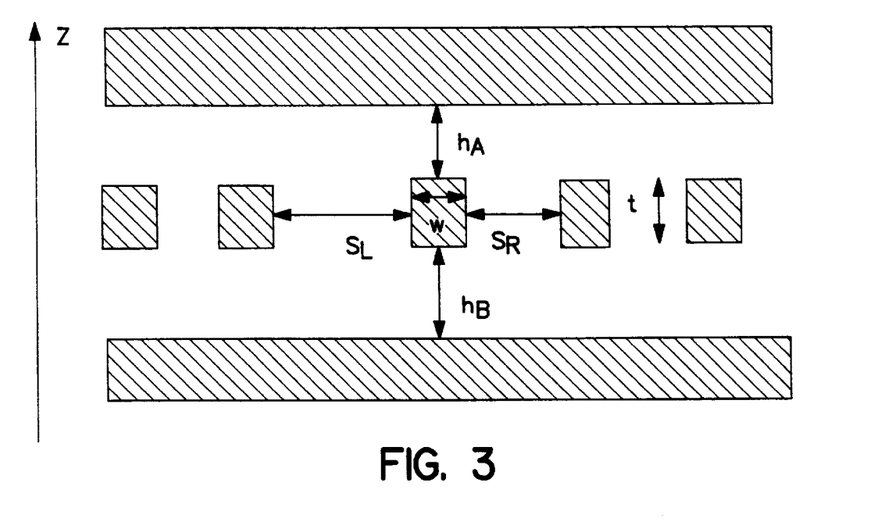
FIG. 3 is also a cross-sectional view of a conductive wire within an integrated circuit, shown in greater detail, depicting the parameters defining the physical dimensions associated with the conductive wire.

For any of the metal lines (conductive wires) depicted in FIGS. 1 or 2, the surrounding structure can be simplified and detailed as appears in FIG. 3. FIG. 3 depicts six geometric parameters which can be used to describe the structure in which the conductive wire lies, and which can be used to calculate the parasitic capacitance of the conductive wire for which a capacitance expression is being sought. These six parameters are:

w=width of the metal line under consideration;

t=thickness of the metal line under consideration;

$h_A$=distance between the metal line and the conductor level above (for a top metal level, $h_A$=infinite);

$h_B$=distance between the metal line and the conductor level below;

$S_L$=separation to the left adjacent metal line on the same wiring level; and $S_R$=separation to the right adjacent metal line on the same wiring level.

The present invention relates to simplification methods for extracting capacitance expressions for a conductive wire within an integrated circuit. An exemplary simplification method for extracting capacitance expressions includes the following steps:

1. A conductive wire within an integrated circuit is first generally defined in relation to the structure in which it is contained. The conductive wire is then defined with more specificity using parameters which describe the physical dimensions of the conductor and the other conducting features within the same structure of the integrated circuit.

2. The particular conductive wire for which parasitic capacitance will be calculated between the wire and its neighbor, is identified. This particular conductive wire will be defined in relation to the other structural features of conductors which are close to it and, thus, will affect capacitance of the identified wire. Such features include, for example, a conductive layer above or below the identified wire and conductive wires situated close laterally to the identified conductive wire. The structure which includes the identified wire may be considered as "structure A."

3. Limiting cases "structure A1" and "structure A2" are selected based upon structure A, where A1 and A2 represent structures for which one or more of the parameters defining structure A are maximized (substantially infinite) or minimized (substantially zero). These limiting cases are chosen to reduce the number of parameters which will be is needed to derive a mathematical expression for capacitance by way of interpolation or extraction.

4. The limiting cases of structure A1 and structure A2 are established and studied.

5. For each of the limiting cases A1 and A2, a simplification scheme is used whereby the parasitic capacitance may be expressed as a function of a reduced number of parameters, based on the physical features of these limiting cases.

6. The parameters upon which capacitance will be calculated are varied to produce different physical structures. For each of the physical structures, capacitance is measured or simulated for different values of the studied parameters, to generate a data set which provides a relationship which may be a curve representing capacitance measured or simulated at different values of the parameter studied.

7. For each of the limiting cases, the relationship (capacitance versus varied parameter) obtained from the data set is used to interpolate or extract a mathematical formula for calculating capacitance for each of the limiting cases.

8. Based once again on the limiting cases, a typical capacitance curve is selected which represents capacitance expressed as a function of the parameters appearing in the initial set of equations achieved. The capacitance curves are also chosen because of their behavior, or because of the behavior of their first order derivative, because the limiting cases will behave in a simplified way at certain regions of the capacitance curve.

9. Another set of limiting cases are then established based upon the curve or the first order derivative of the expression defining the curve, and the region where the studied parameter can be expressed as substantially 0, or substantially infinity, or the region where the capacitance value varies linearly with the parameter.

10. A simplification scheme is applied to the limiting cases, to express the capacitance for the limiting cases as a function of two parameters (or parameter ratios) or less.

11. One of the parameters (or parameter ratios) may be fixed. The other parameter is varied to produce varying structural cases of the limiting cases. Capacitance data is then measured or simulated for each of the different values of the parameter (or parameter ratios) studied, producing a relationship which may be a data set representing capacitance versus the chosen and varied parameter (or parameter ratios).

12. The specific form of a mathematical expression for calculating capacitance is derived based on an interpolation of the above data set.

13. Using the specific form of the capacitance equation derived in step 12 above, the parasitic capacitance for the particular conductive wire identified in step 2 above may be calculated by inputting the parameters which define the structure containing the particular conductive wire for which capacitance data is sought.

The following extractions are by way of example only and illustrate the simplification approach used to extract mathematical formulas suitable to calculate the parasitic capacitance. The first approach to the simplification method will be illustrated with reference to FIG. 3.

Geometric parameters other than the six previously listed in FIG. 3, such as the width of the adjacent wire to the left and the right, the spacing between the left wire and its left neighbor, and the spacing between the right wire and its right neighbor, need not enter into the extraction process. This elimination is done to simplify the extraction process. The error caused by such simplification will be minimal. Because each of the six listed variables may take different values (from very small to very large), a direct extraction would require many capacitance values which are either measured experimentally or simulated using an electric field solver to solve a matrix equation (which is a large set of linear equations). The capacitance value per unit length is unchanged if all six variables are scaled by the same constant. For the conductive wire depicted in FIG. 3 containing a structure defined by six parameters, the total number of data points needed is thus on the order of $N^5$, denoted as $O(N^5)$, where N is the number of different values that each parameter will take in the data set.

EXAMPLE 1

This simplification approach may be applied to the set of limiting cases depicted in FIGS. 5A, 5B, and 5C to provide an example of the present invention. FIGS. 5A, 5B, and 5C depict a conductive wire on top of a single metal film, without another conductive layer on top of the wire. For such a metal wire at a top metal level, depending on whether there are wires on both sides, one side only, or none at all, the limiting cases are illustrated in FIGS. 5A, 5B, and 5C, respectively. The extraction procedure will handle the extreme cases, such as those shown in FIGS. 5A, 5B, and 5C. The number of capacitance data needed for this extraction are: $O(N^4)$, $O(N^3)$, and $O(N^2)$, for the configurations in 5A, 5B, and 5C, respectively.

The extraction method of the present invention reduces the number of capacitance data points needed by focusing on left-right symmetric structures as a first step. When $S_L$ is not equal to $S_R$, the capacitance value may be approximated by the average of the two left-right symmetric structures, calculated as follows:

$$Cap(w, t, s_L, s_R, h_A, h_B) \approx$$
$$\frac{1}{2}[Cap(w, t, s_L, s_L, h_A, h_B) + Cap(w, t, s_R, s_R, h_A, h_B)].$$

For example, the capacitance for the structure of FIG. 5B is equal to one-half the total capacitance for the structures shown in FIG. 5A and in FIG. 5C. In this way, no extraction data is needed for the structure shown in FIG. 5B. In addition, the number of capacitance data points for FIG. 5A is reduced from $O(N^4)$ to $O(N^3)$. The left-right symmetrical simplification can also be applied to the structures in FIGS. 4A, 4B, and 4C.

Next, the extraction method of the present invention reduces the number of data points needed for extraction by focusing further on up-down symmetric structures only. For a left-right symmetric structure with unequal up-down level spacings (i.e. $h_A$ is not equal to $h_B$), the wiring capacitance is calculated by taking the average of the two, equal, up-down level spacing structures:

$$Cap(w, t, s, s, h_A, h_B) = \frac{\varepsilon \varepsilon_0}{2}[c(w, t, s, h_A) + c(w, t, s, h_B)],$$

where $\epsilon_0$ is the permittivity of a vacuum and $\epsilon$ is the relative dielectric constant for the dielectric material separating the conductive wires. When s becomes infinite, c(w, t, s, h) corresponds to the structure shown in FIG. 5C. For the example in FIG. 5C, the number of data points needed to extract capacitance will remain unchanged.

The capacitance expression for one of the limiting cases, the configuration depicted in FIG. 5C (one isolated wire above a plane), is extracted as follows. This configuration represents an exception to the above capacitance equation because the capacitance for one isolated wire above a plane depends only upon the width w of the wire, the thickness t of the wire, and the distance $h_B$ between the wire and the underlying metal plane. Thus, a separate extraction expression is needed for FIG. 5C: Cap[FIG. 5C]=$\epsilon\epsilon_0$C(w, t, $h_b$). To summarize, up to this stage, only one two-variable capacitance data set of size $O(N^2)$ (the variables w, t, and h, one of which can be fixed) is needed for FIG. 5C.

Using the expression Cap[FIG. 5C]=$\epsilon\epsilon_0$C(w, t, $h_b$), the method of extraction for capacitance for the situation of one wire above a plane, as illustrated in FIG. 5C, is now presented. Given a full capacitance data set of size $O(N^2)$, the data set can be fit into an analytic 2D function which depends on two ratios: h/t and w/h. One approach is to use 2D cubic spline interpolation to obtain capacitance values at other parameter points. Such an interpolation scheme requires that the data points cover the whole 2D region. Alternatively, the following presents a specific method of capacitance extraction which does not require a full set of data points.

Figure 6A:
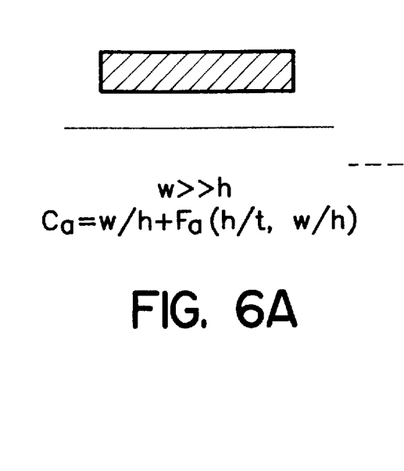
FIG. 6A depicts a wide conductive wire.
Figure 6B:
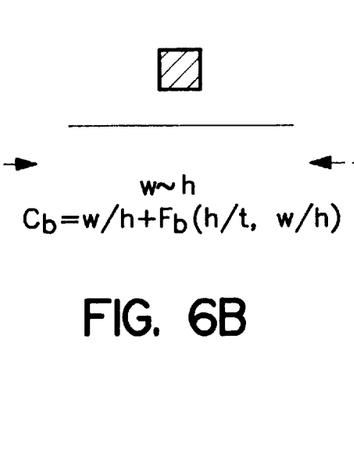
FIG. 6B depicts a conductive wire having a height and width of similar dimension.
Figure 6C:
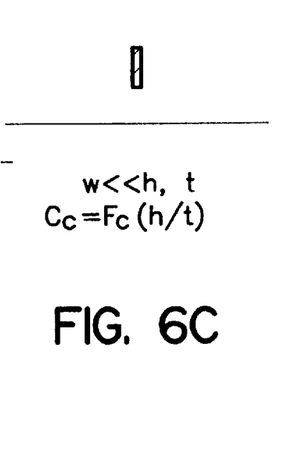
FIG. 6C depicts a conductive wire having a negligible width.

The capacitance of FIG. 5C is extracted in two stages (see FIGS. 6A, 6B, and 6C). FIGS. 6A, 6B, and 6C represent further limiting cases of a single conductive wire above one metal plane. For these cases, $h_A$=infinite, s=infinite, and $h_B$=h. FIG. 6A shows a very wide wire, and FIG. 6C depicts a wire of negligible width. The two stages for extracting a capacitance formula include the first stage which may be an interpolation or an extraction, and the second stage which is an interpolation.

The first stage considers its two limiting situations: (1) w/h is large (for example w/h greater than or equal to five) (FIG. 6A); and (2) w is much smaller than both h and t (FIG. 6C). A two-dimensional data set is needed only for the region w>>h (for example w≧5h) as in FIG. 6A. In this region, the dependency on the ratio w over h is weak for the fringe capacitance $F_a$(h/t, w/h). The extraction expression for the fringe capacitance $F_c$(h/t) for FIG. 6C can be obtained by either fitting a suitable 1D function to a set of capacitance data forming a curve for the case w<<h,t or by using cubic spline interpolation. Then, for the second stage (for FIG. 6B), an interpolation is performed between the two limiting cases of FIGS. 6A and 6C.

As an alternative to using a 1D function or cubic spline interpolation to derive the expression for $F_c$(h/t), this expression may be derived after further simplification. The simplification which may be used is that w equals 0. Essentially, this is the limiting case of FIG. 6C where the conductive wire has almost no width, w. The extracted expression $F_c$(h/t) after such simplification is:

$$F_c = 2\frac{K\left(\sqrt{1-\eta^2}\right)}{K(\eta)} \quad \eta = \frac{h}{h+t} \quad w = 0,$$

where K is a complete elliptical integral of the first kind.

An example of a way to obtain an extraction expression for one isolated wide wire above a plane $F_a$(h/t,w/h) is to derive it by using the condition w>>h (as in FIG. 6A). The extracted expression $F_a$, so derived, may be summarized as follows. $w_1$ is defined as:

$$w_1 = \frac{2h}{\pi\sqrt{a}}\left[a - (a+1)\left(\frac{1}{2} + \ln 2\right) + \frac{1}{2}(\sqrt{a}+1)^2\ln(a-1) - 2\sqrt{a}\ln(\sqrt{a}-1)\right],$$

where $$\sqrt{a} = \frac{1+\sqrt{1-\eta^2}}{\eta} \quad \eta = \frac{h}{h+1}.$$

Note that the ratio $w^1$/h depends only on the ratio of h/t. When w is larger than or equal to $w_1$, the fringe capacitance is $$F_a = \frac{2}{\pi}(u + \ln g_n) \text{ if } w \geq w_1$$

-continued $$u = 1 + \ln\frac{a-1}{2a} + \frac{a+1}{2\sqrt{a}}\ln\frac{\sqrt{a}+1}{\sqrt{a}-1}$$

$$g_n = g_0 + \frac{1}{2}(a+1)\ln g_{n-1} \quad n = 1, 2, 3, \ldots$$

This substitution should be repeated a number of times and stopped when $g_n - g_{n-1} < 10^{-3}$. Also, $$g_0 = \frac{\pi\sqrt{a}}{2h}(w - w_1) + a.$$

Figure 7:
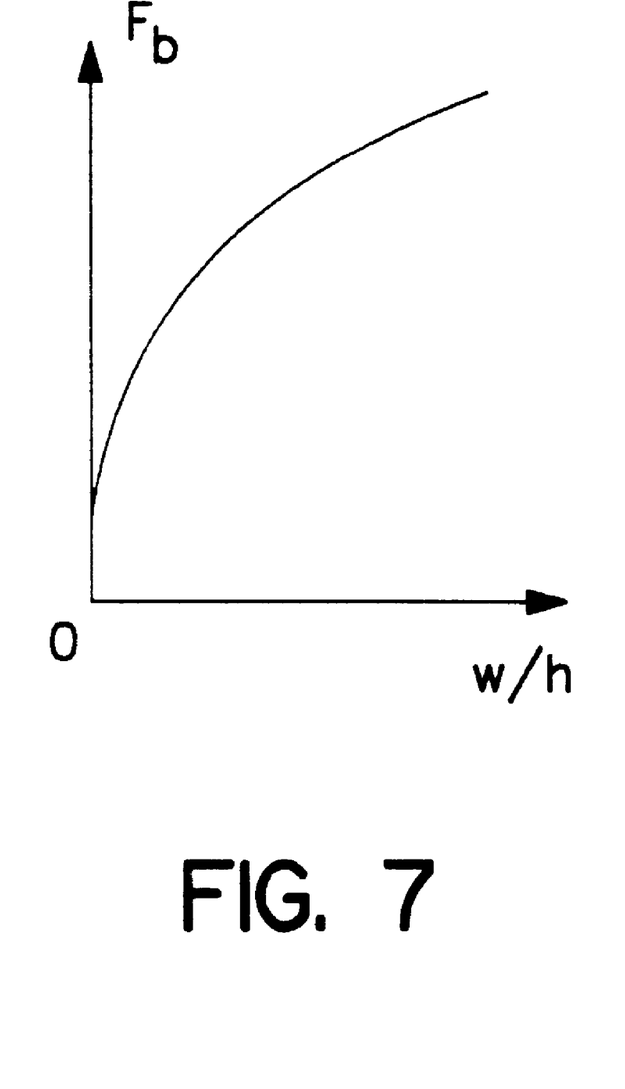
FIG. 7 illustrates a capacitance curve (fringe capacitance)

The second stage gives the general extraction expression by interpolating between the two limiting cases of FIGS. 6A and 6C. If only one of $F_a$ and $F_c$ is obtained but not both, then either $F_b$(h/t, w/h)=$F_a$(h/t, $w_{1/h}$) or $F_b$(h/t, w/h)=$F_c$(h/t) may be used. If both $F_a$ and $F_c$ are obtained, then an interpolation method is used to obtain $F_b$(h/t, w/h). A better interpolation scheme obtains a set of capacitance values as a function of w/h and varies from w =0 to w=$w_1$, for only one chosen value of h/t (for example at h/t=1). Using this scheme, only a data set of O(N) is needed. A typical fringe capacitance curve plotted as a function of the ratio w/h is shown in FIG. 7. The curve illustrates the fringe capacitance $F_b$ as a function of the parameter h/t. The curve is chosen so that limiting cases based on the curve may be selected and used to extract the form of the equation which will be used to calculate the fringe capacitance for the limiting case of FIG. 6B.

The behavior of the curve in FIG. 7 can be characterized by the following:

1. The fringe capacitance always increases with the ratio w/h, and does not reach a constant even when the ratio w/h is very large. The fringe capacitance satisfies the inequalities:

$$F_c\left(\frac{h}{t}\right) \leq F_b\left(\frac{h}{t}, \frac{w}{h}\right) \leq F_a\left(\frac{h}{t}, \frac{w}{h}\right).$$

2. There is a very large change rate for the fringe capacitance at w=0, and the change rate tends to reach a constant when the ratio w/h becomes large.

3. The fringe capacitance curve is a function of the ratio w/h and has a negative second derivative in the whole region.

Because the relationship of the above equation has been established and it is understood that the fringe capacitance for FIG. 6B ($F_b$) can be extracted based on two parameter sets, h/t and w/h, the interpolation of this expression may be done. In general, the interpolation is expressed as:

$$F_b\left(\frac{h}{t}, \frac{w}{h}\right) = \text{Interpol}\left(F_a\left(\frac{h}{t}, \frac{w_1}{h}\right), F_c\left(\frac{h}{t}\right), \frac{w}{h}\right) \quad w \leq w_1.$$

The interpolation function depends on the ratio h/t only through $F_a$(h/t, $w_1$/h) and $F_c$(h/t). Also, the interpolation function increases its value monatomically as the ratio w/h is increased from w/h=0 to w/h=$w_1$/h. Thus, from one set of measured or calculated capacitance data (using a fixed ratio h/t and varying w/h), the capacitance expression for FIG. 6B ($F_b$) can be extracted.

The equation may be extracted using an interpolation method wherein several examples of the structure with different parameters are used and the capacitance for each example is measured. Once this set of data (measured capacitance versus input parameter) is obtained, any suitable interpolation technique may be used to derive the exact form of the equation.

The typical fringe capacitance curve shown in FIG. 7 is far from a linear line. Thus, a more accurate fitting scheme is to use not only the values at the two end points, w=0 and w=w$_1$, but also the derivatives at the two end points. The change rate or derivative of F$_a$ at w=w$_1$ can be obtained from two near points at w=w$_1^-$ and w=w$_1^+$. The change rate of fringe capacitance at w=0 can also be obtained. Based on the curve in FIG. 7, it can be simplified as being essentially infinite. After such a simplification, the interpolation curve can be either a parabola or a hyperbola which meets the three summarized behaviors presented previously. If a parabola is used, then the expression for fringe capacitance for the structure of FIG. 6B, F$_b$ is:

$$F_b\left(\frac{h}{t}, \frac{w}{h}\right) = F_c\left(\frac{h}{t}\right) + \left[F_a\left(\frac{h}{t}, \frac{w_1}{h}\right) - F_c\left(\frac{h}{t}\right)\right]\sqrt{\frac{w}{w_1}} \quad w < w_1.$$

There is no adjustable parameter in the above expression and there is no further parameter optimization work needed. Alternatively, in order to best fit a given data set, the power of w within the range of zero and one can be varied, $$F_b\left(\frac{h}{t}, \frac{w}{h}\right) = F_c\left(\frac{h}{t}\right) + \left[F_a\left(\frac{h}{t}, \frac{w_1}{h}\right) - F_c\left(\frac{h}{t}\right)\right]\left(\frac{w}{w_1}\right)^\alpha \quad 0 < \alpha < 1.$$

The above interpolation scheme does not make use of the derivative at w=w$_1$. To use the derivative information at w=w$_1$, a hyperbola fits the situation:

$$F_b\left(\frac{h}{t}, \frac{w}{h}\right) = F_c\left(\frac{h}{t}\right) + F_a'\left(\frac{h}{t}, \frac{w_1}{h}\right)\sqrt{\frac{w}{h}\left(\frac{w}{h} + A\right)} \quad \text{if } w < w_1,$$

where $$A = \frac{h}{w_1}\left(\frac{F_a - F_c}{F_a'}\right)^2 - \frac{w_1}{h}.$$

In the above expressions, F$_a$=F$_a$(h/t, w$_1$/h) and F$_c$=F$_c$(h/t). F$_a$'=F$_a$'(h/t, w$_1$/h) denotes the derivative with respect to w/h at w/h=w$_1$/h. Again, there is no adjustable parameter in these expressions and there is no further parameter optimization work needed.

Figure 8A:
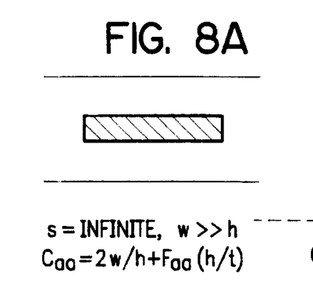
FIG. 8A depicts an isolated wide conductive wire disposed between an upper metal film and a lower metal film.
Figure 8B:
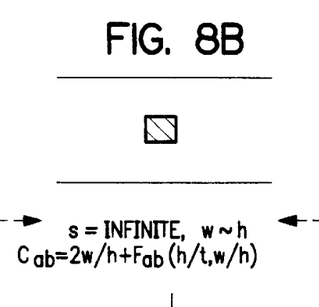
FIG. 8B depicts an isolated conductive wire having a height and width of similar dimension, and disposed between an upper metal film and a lower metal film.
Figure 8C:
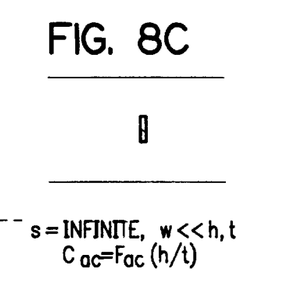
FIG. 8C depicts an isolated narrow conductive wire disposed between an upper metal film and a lower metal film.
Figure 8D:
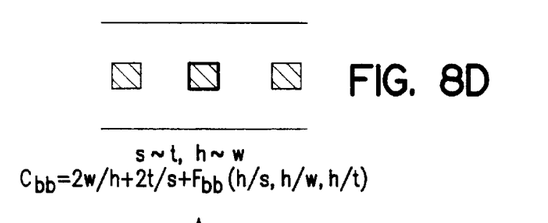
FIG. 8D depicts a nested conductive wire disposed between an upper metal film and a lower metal film.
Figure 8E:
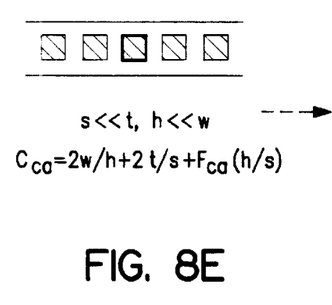
FIG. 8E depicts a tightly nested conductive wire disposed between a proximate set of upper and lower metal films.
Figure 8F:
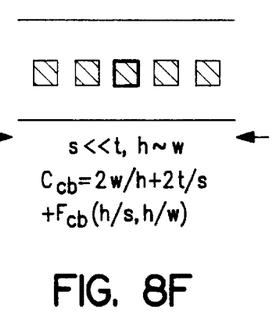
FIG. 8F depicts a tightly nested conductive wire disposed between an upper and lower metal film.

FIGS. 8A–8G depict a number of cross-sections of a wire within an integrated circuit. FIG. 8D is the most general structure, depicting a conductive wire between two neighboring wires and having a metal plane above and below the wires. FIGS. 8B and 8F are limiting cases of the general structure shown in FIG. 8D. For all cross-sections depicted in FIGS. 8A–8C, h$_A$=h$_B$=h and s$_L$=s$_R$=s. The extraction and interpolation method of the present invention may be used to derive a capacitance expression for FIG. 8D once suitable expressions for FIGS. 8B and 8F have been derived. Likewise, a capacitance expression for FIG. 8B may be determined using the present invention through the use of further limiting cases shown in FIGS. 8A and 8C.

EXAMPLE 2

Figure 8G:
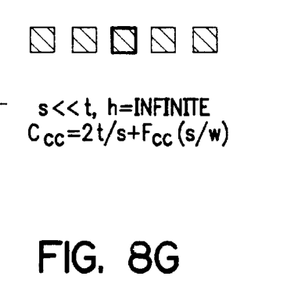
FIG. 8G depicts a tightly nested conductive wire within a single level metalization.

By way of another example, an extraction for the limiting case of FIG. 8F may be done by first treating two additional limiting cases of FIGS. 8E and 8G. These limiting cases represent: (1) h<<w (FIG. 8E) and (2) h=∞(FIG. 8G). Each of FIGS. 8E and 8G needs a capacitance data set of size O(N). Interpolation for the capacitance expression for FIG. 8F needs a third data set of size O(N).

Thus, the size of extraction data set needed for FIG. 8F is reduced from O(N$^2$) to 3N=O(N).

EXAMPLE 3

Extraction for the limiting case of FIG. 8B is done by first considering two additional limiting cases: (1) w>>h (FIG. 8A), and (2) w<<h/t (effectively w=0, FIG. 8C). Each of FIG. 8A and FIG. 8C needs only a capacitance data set of size O(N). Interpolation needs a third data set of size O(N). Thus, the size of the extraction data set needed for FIG. 8B is reduced from O(N$^2$) to 3N (or O(N)).

Continuing with the extraction procedure for the limiting case depicted in FIG. 8B, the fringe capacitance for the case of one isolated wide wire (w>>h) between two planes depends only on the ratio of h/t (FIG. 8A). This fact is expressed in the form of the argument h/t of F$_{aa}$(h/t). An analytic expression for F$_{aa}$(h/t) can be obtained from a set of measured or calculated capacitance values at different h/t points by either using cubic spline interpolation or fitting data to a suitably chosen analytic expression. The size of the data is on the order O(N). The extraction expression for F$_{aa}$ is obtained after making use of the condition w>>h:

$$F_{aa}\left(\frac{h}{t}\right) = \frac{4}{\pi}\left[\left(2 + \frac{1}{y}\right)\ln(1 + 2y) - 2\ln y\right] \quad y = \frac{2h}{t}.$$

Now turning to the extraction expression for one isolated very thin wire between two planes (FIG. 8C), the fringe capacitance for this case depends only on the ratio of h/t (FIG. 8C). This fact is expressed in the form of F$_{ac}$(h/t). An analytic expression for F$_{ac}$(h/t) can be obtained from a set of measured or calculated capacitance values at different h/t points by either using cubic spline interpolation or by fitting data to a suitably chosen analytic expression. The size of data is on the order O(N). This h/t dependency is extracted after a further simplification, w=0:

$$F_{ac} = \frac{4K(\sin\alpha)}{K(\cos\alpha)} \quad \alpha = \frac{\pi t}{2(t + 2h)} \quad w = 0.$$

Having extracted fringe capacitance expressions for each of the limiting cases of FIGS. 8A and 8C, the fringe capacitance behavior for one isolated wire between two planes, FIG. 8B, may now be obtained through interpolation. The fringe capacitance F$_{ab}$ depends on the ratio of h/t only through F$_{aa}$(h/t) and F$_{ac}$(h/t). The specific equation for the fringe capacitance F$_{ab}$ is obtained by first calculating only one set of data points for a fixed ratio h/t. The typical fringe capacitance curve as a function of the ratio w/h is shown schematically in FIG. 9A. Its behavior can be characterized by the following.

Figure 9A:
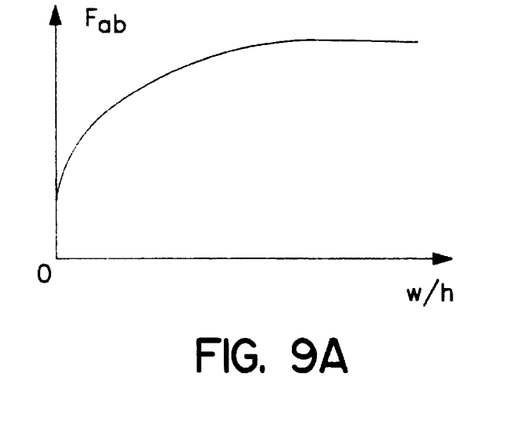
FIG. 9A is a curve of fringe capacitance as a is function of w/h.

(1) The fringe capacitance first increases rapidly with the ratio w/h and then reaches a finite constant when the ratio w/h is large.

(2) There is a very large change rate for the fringe capacitance at w=0.

Figure 9B:
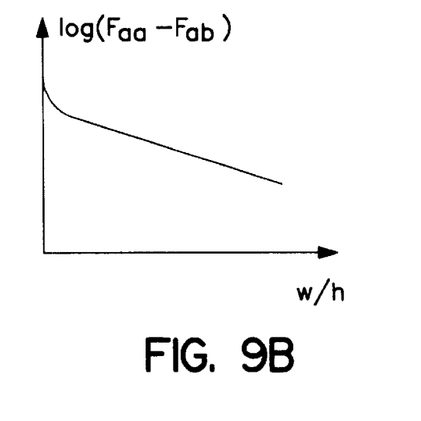
FIG. 9B is a curve showing the log of the difference in fringe capacitances between two structures, as a function of w/h.

(3) The plotting of log(F$_{aa}$–F$_{ab}$) versus w/h shows a straight line behavior away from a small w/h region as illustrated in FIG. 9B.

The interpolation for the fringe capacitance calculation for FIG. 8B can be stated in the following form:

$$F_{ab}\left(\frac{h}{t}, \frac{w}{h}\right) = F_{aa}\left(\frac{h}{t}\right)U\left(\frac{w}{h}\right) + F_{ac}\left(\frac{h}{t}\right)\left[1 - U\left(\frac{w}{h}\right)\right].$$

Note that this is not a linear interpolation in terms of the ratio w/h. As the ratio w/h increases from w/h=0 to w/h=∞, the interpolation function U(w/h) increases monatomically from U(0)=0 to U(∞)=1. Stated differently, 0≦U(x)≦1 within the region of 0≦x≦∞. The specific form of U(w/h) can be extracted from a set of capacitance data measured or calculated at a fixed ratio of (h/t). That is, the parameter set w/h is varied to produce different examples of this structure, and the capacitance is measured for the various examples.

SUMMARY

The above examples represent three approaches and two detailed examples of the simplification scheme of the present invention. An extraction and interpolation method is used, in conjunction with limiting cases of a conductive wire within a structure within an integrated circuit, to produce an expression from which the parasitic capacitance of the conductor wire can be calculated using the six variables describing the physical structure of the interconnect wire. FIGS. 8A–8G illustrate a number of approaches whereby a set of limiting cases may be used to extract an expression for calculating parasitic capacitance for a more generalized structure. FIGS. 8A and 8C may be seen as limiting cases for FIG. 8B; FIGS. 8E and 8G may be seen as limiting cases for FIG. 8F; and FIGS. 8B and 8F may be seen as limiting cases for FIG. 8D.

In the above examples, interpolations are done for the fringe capacitance. Alternatively, the extraction method and interpolations can be done for the total (area plus fringe) capacitance. Because the changes in fringe capacitance at two ends of an interpolation usually are smaller than the change of the total capacitance, interpolated fringe capacitance values are less sensitive to the actual interpolation functions used, and thus, interpolating fringe capacitance is a better choice.

The previous examples were chosen to illustrate the simplification method of the present invention. The method extracts capacitance expressions used to calculate the capacitance of a conductor wire within an integrated circuit based on mathematical expressions, as opposed to solving a large matrix equation. Although illustrated and described herein with reference to certain specific examples, the present invention is nevertheless not intended to be limited to the details shown. Rather, various modifications may be made in the details within the scope and range of equivalents of the claims and without departing from the spirit of the invention. Such modifications include, for example, various structures for the conductive wire within the integrated circuit and various methods for choosing limiting cases based on the initial structure.

What is claimed:

1. A method for approximating the parasitic capacitance of a conductor within an integrated circuit of a plurality of integrated circuits, the method comprising the steps of:
   a) providing the integrated circuit;
   b) defining a further parasitic capacitance as a function of a data set including physical attributes corresponding to a further conductor within one of the plurality of integrated circuits;
   c) selecting a first plurality of limiting cases to reduce a plurality of variables used to interpolate a plurality of mathematical formulas to compute the further parasitic capacitance for each of the first plurality of limiting cases;
   d) performing a first layer interpolation to derive each of the plurality of mathematical formulas;
   e) deriving a mathematical expression for calculating the further parasitic capacitance based upon the data set, by performing a second layer interpolation between the plurality of mathematical formulas, the second layer interpolation comprising the steps of:
      selecting a second plurality of limiting cases; and
      performing the second layer interpolation using the second plurality of limiting cases to derive the mathematical expression; and
   f) calculating the parasitic capacitance of the conductor using the mathematical expression.

2. The method of claim 1, wherein the plurality of variables includes a plurality of physical attributes corresponding to the further conductor within one of the plurality of integrated circuits.

3. The method of claim 1, wherein the first plurality of limiting cases are selected to produce mathematical formulas to reduce a second plurality of variables required to perform the second layer of interpolation.

4. The method of claim 1, wherein the parasitic capacitance of the conductor is calculated based upon a further data set including further physical attributes corresponding to the conductor.

5. The method of claim 4, wherein the further physical attributes include the dimensions of the conductor and the distances between the conductor and a plurality of conducting elements included within the integrated circuit.

6. The method of claim 1, wherein the first layer interpolation comprises a cubic spline interpolation.

7. The method of claim 1, wherein the second layer interpolation comprises a cubic spline interpolation.

8. The method of claim 1, wherein the physical attributes include the dimensions of the further conductor and the distances between the further conductor and a plurality of conducting elements included within one of the plurality of integrated circuits.

9. The method of claim 8, wherein at least one of the first plurality of limiting cases is selected wherein the data set includes at least one of the attributes being substantially infinite.

10. The method of claim 8, wherein at least one of the first plurality of limiting cases is selected wherein the data set includes at least one of the attributes being substantially zero.

11. The method of claim 8, wherein the first plurality of limiting cases comprises a set of limiting cases, wherein one of the set includes a first attribute which is substantially infinite and a second of the set includes a first attribute which is substantially zero.

12. The method of claim 1, wherein the second plurality of limiting cases are selected based upon a plurality of capacitance data curves.

13. The method of claim 1, wherein the second plurality of limiting cases are chosen to reduce a further plurality of variables necessary to interpolate the mathematical expression for computing the parasitic capacitance.

14. A method for approximating the parasitic capacitance of a conductor within an integrated circuit of a plurality of integrated circuits, the method comprising the steps of:
   a) providing the integrated circuit;
   b) defining a further parasitic capacitance as a function of a data set including physical attributes corresponding to a further conductor within one of the plurality of integrated circuits;

c) selecting a first plurality of limiting cases to reduce a plurality of variables used to extract a plurality of mathematical formulas to compute the further parasitic capacitance for each of the first plurality of limiting cases;

d) extracting the plurality of mathematical formulas;

e) deriving a mathematical expression for calculating the further parasitic capacitance based upon the data set, by performing an interpolation between the plurality of mathematical formulas, the interpolation comprising the steps of:

selecting a second plurality of limiting cases; and performing the interpolation using the second plurality of limiting cases to derive the mathematical expression; and f) calculating the parasitic capacitance of the conductor using the mathematical expression.

15. The method of claim 14, wherein the interpolation comprises a cubic spline interpolation.

16. The method of claim 14, wherein the plurality of variables includes a plurality of physical attributes corresponding to the further conductor within one of the plurality of integrated circuits.

* * * * *